(12) United States Patent
Takahashi

(10) Patent No.: US 7,470,033 B2
(45) Date of Patent: Dec. 30, 2008

(54) REFLECTION-TYPE PROJECTION-OPTICAL SYSTEMS, AND EXPOSURE APPARATUS COMPRISING SAME

(75) Inventor: Tomowaki Takahashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 124 days.

(21) Appl. No.: 11/712,232

(22) Filed: Feb. 27, 2007

(65) Prior Publication Data

US 2007/0223119 A1 Sep. 27, 2007

(30) Foreign Application Priority Data

Mar. 24, 2006 (JP) ............... 2006-081856

(51) Int. Cl.
  G02B 5/10 (2006.01)
  G21K 5/00 (2006.01)
  G03B 27/42 (2006.01)
(52) U.S. Cl. ............... 359/859; 355/53; 378/34
(58) Field of Classification Search ......... 359/365, 359/859; 355/53; 378/34
   See application file for complete search history.

(56) References Cited

U.S. PATENT DOCUMENTS

| 5,686,728 | A | 11/1997 | Shafer |
| 6,109,756 | A | 8/2000 | Takahashi |
| 6,172,825 | B1 | 1/2001 | Takahashi |
| 6,213,610 | B1 | 4/2001 | Takahashi et al. |
| 6,302,548 | B2 | 10/2001 | Takahashi et al. |
| 6,556,648 | B1 | 4/2003 | Bal et al. |
| 6,710,917 | B2 | 3/2004 | Mann et al. |
| 6,781,671 | B2 | 8/2004 | Komatsuda |
| 7,283,206 | B2 * | 10/2007 | Takahashi ............... 355/67 |
| 2002/0129328 | A1 | 9/2002 | Komatsuda |
| 2004/0125353 | A1 | 7/2004 | Takahashi |
| 2004/0189965 | A1 | 9/2004 | Takahashi |
| 2004/0189968 | A1 | 9/2004 | Terasawa |
| 2006/0098273 | A1 | 5/2006 | Takahashi |
| 2007/0126990 | A1 * | 6/2007 | Takahashi ............... 353/53 |

FOREIGN PATENT DOCUMENTS

| JP | 2002-116382 | 4/2002 |
| JP | 2005-189248 | 7/2005 |
| JP | 2005-315918 | 11/2005 |
| WO | WO 2005/062101 A1 | 12/2004 |

* cited by examiner

Primary Examiner—Alessandro Amari
(74) Attorney, Agent, or Firm—Klarquist Sparkman, LLP

(57) ABSTRACT

Projection-optical systems are disclosed that have a large image-side NA of, e.g., $\geq 0.45$, and that allow inspection for surface-shape errors of reflecting surfaces with prescribed precision. A first reflective image-forming optical system forms an intermediate image of a first surface. A second reflective image-forming optical system forms a reduced image, on a second surface, of the intermediate image. The first reflective image-forming optical system has a first concave mirror, a second convex mirror, a third mirror, and a fourth concave mirror. The second reflective image-forming optical system has a fifth concave mirror, a sixth mirror, a seventh convex mirror, and an eighth concave mirror. If the absolute value of the center radius of curvature of the reflective surface of the second mirror is $RM_2$, and the maximum object height on the first surface is $H_0$, then the condition $1 < RM_2/H_0 < 6$ is satisfied.

37 Claims, 8 Drawing Sheets

REFLECTION-TYPE PROJECTION-OPTICAL SYSTEMS, AND EXPOSURE APPARATUS COMPRISING SAME

This application claims priority to Japan Patent Application No. 2006-081856, filed on Mar. 24, 2006, the contents of which are incorporated herein by reference.

FIELD

This disclosure relates to projection-optical systems, exposure apparatus, and device-manufacturing methods using such exposure apparatus. The projection-optical systems are reflection-type projection-optical systems suitable for X-ray projection-exposure apparatus (e.g., lithographic exposure apparatus) that utilize X-rays for transferring a circuit pattern, defined on a mask or reticle, onto a photosensitive substrate by a mirror-projection method.

BACKGROUND

In the past, exposure apparatus using X-rays has attracted attention for use as lithographic-exposure apparatus used in the manufacture of semiconductor devices and other products. When using X-rays as exposure light, since there are no X-ray-transmissive optical materials or refractive optical materials that can be used for making lenses, a reflective mask is used. Also, the projection-optical system is a reflection-type projection-optical system. One conventional type of reflection-type projection-optical system usable in exposure apparatus employing X-rays as the exposure light comprises eight reflective mirrors, such as disclosed in U.S. Pat. No. 6,710,917 (corresponding to Japanese Laid-Open Patent Document No. 2002-139672).

In the conventional projection-optical system disclosed in the '917 patent, the image-side numerical aperture (NA) is 0.4. But, it would be desirable to increase the image-side NA further to achieve higher resolution. In addition, this conventional projection-optical system comprises reflective mirrors having aspherical reflecting surfaces having extremely large absolute values of center radii of curvature. Effective methods for inspecting such surfaces, for surface-shape errors, do not yet exist. Currently, the most effective inspection method utilizes the principle in which light that has passed through a pinhole is reflected by the aspherically-shaped reflective surface. But, surface-shape errors cannot be inspected and detected with the desired precision unless the absolute value of the center radius of curvature of the reflective surface is less than a certain value.

SUMMARY

This invention was devised in consideration of the problem summarized above. An object of the invention is to provide projection-optical systems having a comparatively large image-side numerical aperture (NA) of, for example, 0.45 or greater, and that can be inspected, with the desired precision, for surface-shape errors in their reflective surfaces. A further object is to provide exposure apparatus that comprise such projection-optical systems for use with, for example, X-rays as the exposure light, and that perform projection-exposures at high resolution.

Additional objects and advantages of the invention will be set forth in part in the description that follows, and in part will be apparent from the description, or may be learned by practice of the invention. The objects and advantages of the invention will be realized and attained by means of the elements and combinations particularly pointed out in the appended claims.

According to one aspect of the invention, projection-optical systems are provided. An embodiment of a projection-optical system comprises eight reflective mirrors that collectively form a reduced image, on a second surface, of a first surface. The embodiment also comprises a first reflective image-forming optical system that forms an intermediate image of the first surface, based on light from the first surface. A second reflective image-forming optical system forms the reduced image on the second surface, based on light from the intermediate image. The first reflective image-forming optical system comprises, in order of light incidence from the first surface, a first reflective mirror having a concave reflective surface, a second reflective mirror having a convex reflective surface, a third reflective mirror, and a fourth reflective mirror having a concave reflective surface. The second reflective image-forming optical system comprises, in order of light incidence from the intermediate image, a fifth reflective mirror having a concave reflective surface, a sixth reflective mirror, a seventh reflective mirror having a convex reflecting surface, and an eighth reflective mirror M8 having a concave reflective surface. The system further satisfies the condition $1<RM_2/H_0<6$, wherein $RM_2$ is the absolute value of the center radius of curvature of the reflective surface of the second mirror, and $H_0$ is the maximum object height on the first surface.

According to another aspect, exposure apparatus are provided. An embodiment of such an apparatus comprises an illumination-optical system situated and configured to illuminate a mask situated on the first surface. The embodiment also includes a projection-optical system (according to any of the embodiments of the first aspect) situated and configured to project the pattern of the mask onto a photosensitive substrate situated on the second surface.

According to yet another aspect, device-manufacturing methods are provided. An embodiment of such a method comprises an exposure process, in which an exposure apparatus according to the second aspect is used to expose a photosensitive substrate to the mask pattern. A development step is conducted after the exposure to develop the photosensitive substrate.

In another embodiment of an eight-mirror reflection-type double-image-forming projection-optical system, one or more specific conditions are satisfied, including a condition relating to the center radius of curvature of the reflective surface of the second mirror. The projection-optical systems can have a comparatively large image-side numerical aperture (numerical aperture on the side of the second surface), of for example 0.45 or greater. This facilitates inspections, with prescribed precision, for surface-shape errors in the reflective surfaces of the mirrors. Further, by including a projection-optical system in an exposure apparatus, X-rays can be used as the exposure light.

In the subject exposure apparatus, the mask and photosensitive substrate are moved relative to the projection-optical system during exposure. Thus, the pattern defined on the mask is projected onto the photosensitive substrate, at high resolution, to expose the substrate. As a result, scanning-type exposure apparatus, providing high resolving power, can be used, under satisfactory exposure conditions, to manufacture high-precision devices.

DETAILED DESCRIPTION

Figure 3:
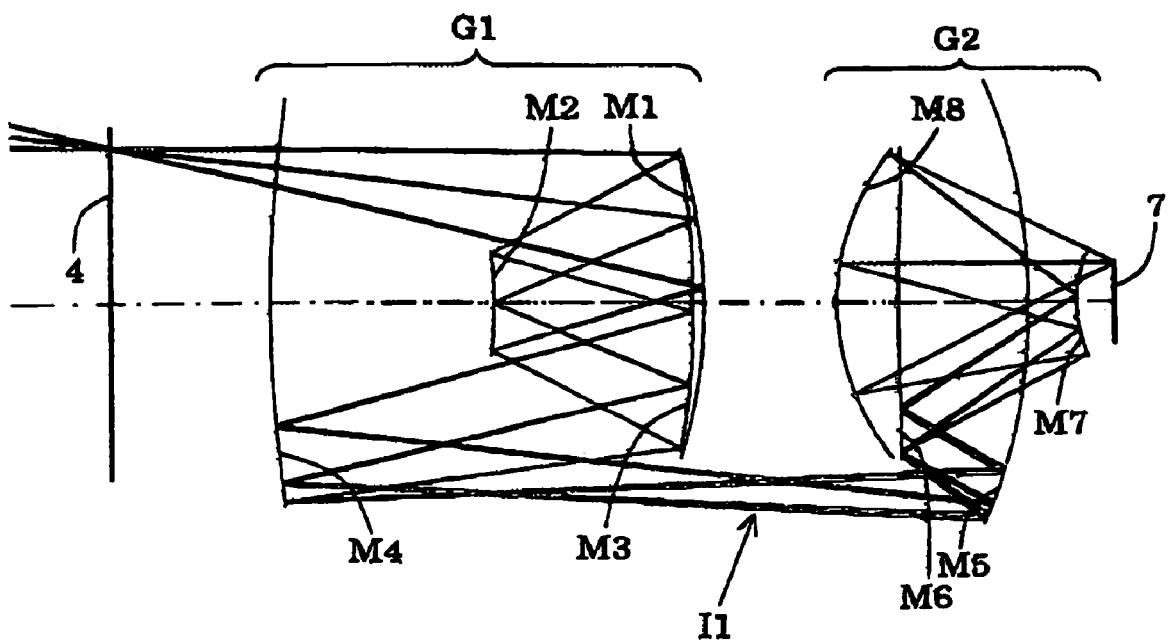
FIG. 3 is an optical diagram of a first embodiment of a projection-optical system.

An embodiment of a projection-optical system comprises eight reflective mirrors M1-M8. Referring, for example, to FIG. 3, light from a first surface (called the "object surface") passes through a first reflective image-forming optical system G1, which forms an intermediate image of the first surface. Light from the intermediate image passes through a second reflective image-forming optical system G2, which forms a final reduced image of the first surface (i.e., an image of the intermediate image) on a second surface (called the "image surface"). The intermediate image of the first surface is formed in the optical path between the first reflective image-forming optical system G1 and the second reflective image-forming optical system G2. The first reflective image-forming optical system G1 has, in the order of incidence of light from the first surface, a first reflective mirror M1 that is concave; a second reflective mirror M2 that is convex; a third reflective mirror M3; and a fourth reflective mirror M4 that is concave. The second reflective image-forming optical system G2 has, in order of incidence of light from the intermediate image, a fifth reflective mirror M5 that is concave; a sixth reflective mirror M6; a seventh reflective mirror M7 that is convex; and an eighth reflective mirror M8 that is concave.

The embodiment of a reflective projection-optical system described above (producing two images using eight mirrors) satisfies the following conditional Equation (1), in which $RM_2$ is the absolute value of the center radius of curvature (vertex radius of curvature) of the reflective surface of the second mirror M2, and $H_0$ is the maximum object height on the first surface.

$$1 < RM_2/H_0 < 6 \qquad (1)$$

If the upper limit of conditional Equation (1) is exceeded, it is difficult to achieve a comparatively large image-side numerical aperture (NA on the second-surface side) of 0.45 or greater, for example. If the absolute value $RM_2$ (the center radius of curvature of the second mirror M2) is too large, it is difficult to inspect the reflective surface of the second mirror M2 for surface-shape errors with the prescribed precision. It also is difficult to manufacture the second mirror M2 with the prescribed precision. If $RM_2$ has a value that causes $RM_2/H_0$ to fall below the lower limit of conditional Equation (1), then it is easy to provide a comparatively large image-size NA (e.g., 0.45 or greater); but, because $RM_2$ is too small, various aberrations tend to arise. To achieve even more advantageous results, the upper limit of conditional Equation (1) desirably is 5, and the lower limit desirably is 2.

A projection-optical system according to this embodiment, employing eight reflective mirrors and by having the reflective surface of the second mirror M2 satisfy conditional Equation (1), can achieve a comparatively large image-side NA of, e.g., 0.45 or greater. This embodiment also allows inspections for surface-shape errors in the reflective surfaces of the mirrors to be performed with prescribed precision. Such a projection-optical system used in an exposure apparatus achieves very high resolving power when using, for example, X-rays as the exposure light. Such resolution allows projection exposures to be performed with very high resolution.

Providing a power arrangement for the first and second reflective image-forming optical systems G1 and G2 as described above avoids having to increase the center radii of curvature of the mirrors forming the double-image-forming optical system. This arrangement also allows the angles of incidence of rays on each of the mirrors to be kept comparatively small, which reduces the effective diameters of the mirrors and provides a compact optical system having a large NA.

In the embodiment described above, the second mirror M2 is convex. The mirror M2 is second from the object side (first-surface side) in the first reflective image-forming optical system G1. Arranging the optical elements such that the convex mirror M2 is situated between the first (concave) mirror M1 and the fourth (concave) mirror M4 allows the effective diameters of certain mirrors (e.g., of the fourth mirror M4 or the fifth mirror M5, which normally tend to be large) to be reduced. In addition, the respective angles of incidence of rays on each reflective mirror are kept comparatively small while keeping the absolute values of center radii of curvature of the mirrors within a prescribed range.

In the embodiment described above, the seventh mirror M7 is convex. The mirror M7 is seventh from the object side and is located in the second reflective image-forming optical system G2. Arranging the optical elements such that the convex mirror M7 is situated between the fifth (concave) mirror M5 and the eighth (concave) mirror M8 allows the effective diameters of certain mirrors (e.g., the fourth mirror M4 or the fifth mirror M5, which normally tend to be large) to be reduced. In addition, the respective angles of incidence of rays on each reflective mirror are kept comparatively small while keeping the absolute values of center radii of curvature of the mirrors within a prescribed range.

This embodiment provides a satisfactorily balanced arrangement of the convex mirrors M2 and M7 in the first and second reflective image-forming optical systems G1 and G2, respectively. Consequently, the Petzval sum of the optical system can be maintained at a satisfactory value, which allows various aberrations to be satisfactorily corrected. Thus, a high-performance optical system is provided and angles of incidence of rays on the reflective surfaces of the mirrors are kept comparatively small, which reduces the effective diameters of the mirrors having appropriate center radii of curvature. Also, in this double-image-forming configuration comprising first and second reflecting image-forming optical systems G1 and G2, distortion is satisfactorily corrected. Such a configuration providing, for example, a magnitude of projection magnification (image-forming magnification) of ¼ is compact and achieves excellent optical performance.

It is further desirable that this embodiment satisfy conditional Equation (2), in which $RM_1$ is the absolute value of the center radius of curvature of the reflective surface of the first mirror M1, and $H_0$ is the maximum object height, as explained above.

$$1 < RM_1/H_0 < 6 \quad (2)$$

If the upper limit of conditional Equation (2) is exceeded, the absolute value $RM_1$ of the center radius of curvature of the reflective surface of the first mirror M1 is too large. Consequently, inspecting the surface for shape errors is difficult to perform at a prescribed precision. Also, such a first mirror M1 is difficult to manufacture with a prescribed precision. If $RM_1/H_0$ falls below the lower limit of conditional Equation (2), then the absolute value $RM_1$ of the center radius of curvature of the reflective surface of the first mirror M1 is too small, which allows undesirable aberrations to arise in this reflective surface. In conditional Equation (2), it is even more desirable that the upper limit be 5, and that the lower limit be 2.

In another embodiment, the projection optical system also satisfies conditional Equation (3), in which $RM_4$ is the absolute value of the center radius of curvature of the reflective surface of the fourth mirror M4, and $H_0$ is the maximum object height, as explained above.

$$4 < RM_4/H_0 < 12 \quad (3)$$

If the upper limit of conditional equation (3) is exceeded, the absolute value $RM_4$ of the center radius of curvature of the reflective surface of the fourth mirror M4 is too large. Consequently, inspection of the reflective surface for surface-shape errors is difficult to perform at the prescribed precision. Also, manufacture of the fourth mirror M4 at the prescribed precision is undesirably difficult. If $RM_4/H_0$ falls below the lower limit of conditional Equation (3), then $RM_4$ is too small, resulting in various undesirable aberrations of the reflective surface of the fourth mirror M4. For even more advantageous performance, the upper limit of conditional Equation (3) desirably is 10, and the lower limit desirably is 6.

In yet another embodiment, the projection-optical system also satisfies the following conditional Equation (4), in which $RM_8$ is the absolute value of the center radius of curvature of the reflective surface of the eighth mirror M8, and $H_0$ is the maximum object height, as explained above.

$$0.1 < RM_8/H_0 < 4 \quad (4)$$

If the upper limit of conditional Equation (4) is exceeded, then $RM_8$ is too large, which increases the difficulty of inspecting this reflective surface for surface-shape errors at the prescribed precision, and undesirably increases the difficulty of manufacturing the eighth mirror M8 with the prescribed precision. If $RM_8/H_0$ falls below the lower limit of conditional Equation (4), then $RM_8$ is too small, which causes the reflecting surface to exhibit various undesirable aberrations. For even more advantageous performance, the upper limit of conditional Equation (4) desirably is 3, and the lower limit desirably is 1.

In yet another embodiment, the projection-optical system also satisfies the following conditional Equation (5), in which $RM_3$ is the absolute value of the center radius of curvature of the reflective surface of the third mirror M3, and $H_0$ is the maximum object height, as explained above.

$$4 < RM_3/H_0 < 13 \quad (5)$$

If the upper limit of conditional Equation (5) is exceeded, then $RM_3$ is too large, which increases the difficulty of inspecting this reflective surface for surface-shape errors at the prescribed precision, and undesirably increases the difficulty of manufacturing the third mirror M3 with the prescribed precision. If $RM_3/H_0$ falls below the lower limit of conditional Equation (5), then $RM_3$ is too small, which causes the reflecting surface to exhibit various undesirable aberrations. For even more advantageous performance, the upper limit of conditional Equation (5) desirably is 12, and the lower limit desirably is 5.

In yet another embodiment, the projection-optical system also satisfies the following conditional Equation (6), in which $RM_7$ is the absolute value of the center radius of curvature of the reflective surface of the seventh mirror M7, and $H_0$ is the maximum object height, as explained above.

$$0.1 < RM_7/H_0 < 3 \quad (6)$$

If the upper limit of conditional Equation (6) is exceeded, then $RM_7$ is too large, which increases the difficulty of inspecting this reflective surface for surface-shape errors at the prescribed precision, and undesirably increases the difficulty of manufacturing the seventh mirror M7 with the prescribed precision. If $RM_7/H_0$ falls below the lower limit of conditional Equation (6), then $RM_7$ is too small, which causes the reflecting surface to exhibit various undesirable aberrations. For even more advantageous performance, the upper limit of conditional Equation (6) desirably is 2, and the lower limit desirably is 0.5.

In yet another embodiment, the projection-optical system, the object height on the first surface is $H_0$. Also, in seven of the eight reflective mirrors M1-M8, the absolute value $RM_i$, wherein i=1, 2, 3, 4, 5, 6, 7, 8, of the center radius of curvature of the respective reflective surface, satisfies the following conditional Equation (7).

$$RM_i/H_0 \leq 12 \quad (7)$$

If conditional Equation (7) is satisfied, then the absolute value $RM_i$ of the center radius of curvature of the respective reflective surface of each of the subject mirrors M1-M8 is small compared to conventional systems. Consequently, even in an optical system in which the image-side numerical aperture NA exceeds 0.45, beams can be easily separated at each of the reflective surfaces, which is desirable. For even better performance, the upper limit of conditional Equation (7) is 10.

In yet another embodiment, the projection-optical system also satisfies conditional Equation (8), in which TT is the distance (on the optical axis) between the first surface and second surface (i.e., the distance between object and image), and $H_0$ is the maximum object height, as explained above.

$$4 < TT/H_0 < 8 \quad (8)$$

If the upper limit of conditional Equation (8) is exceeded, the interval TT, as the total length of the optical system, is too large, resulting in the optical system being too large in the axial direction (i.e., along the optical axis). If $TT/H_0$ falls below the lower limit of conditional Equation (8), then in practice it is extremely difficult to design a reflection-type double-image-forming optical system having eight mirrors as described above. For even better performance and to prevent excessive size of the optical system along the axial direction, the upper limit in conditional Equation (8) is 7.

Desirably, an aperture stop is provided at the position of the reflective surface of the second mirror M2, or at a position in proximity thereto. This configuration is effective for securing a large image-side numerical aperture NA in a reflection-type double-image-forming projection-optical system comprising eight mirrors such as described above. Using the aperture stop, a beam can be limited to an arbitrary size, thereby allowing light quantity to be adjusted, which in turn provides adjustment of the focal depth and depth of field at the second surface (image surface). By situating the aperture stop at approximately the position of the reflective surface of the second mirror M2, undesirable blocking of the beam by the aperture stop can be avoided.

To achieve higher resolution using the projection-optical system, it is desirable that the image-side numerical aperture NA of the system be greater than 0.48. It is also desirable that a reduced (demagnified) image be formed in an arc-shaped effective image-formation region in the image plane. It is also desirable that the width of the arc-shaped effective image formation region be greater than 0.5 mm. This configuration, as used in an exposure apparatus, allows projection-exposures to be performed with higher throughput.

In yet another embodiment, the projection-optical system also satisfies the following conditional Equation (9), in which $\phi_M$ is the maximum value of the effective diameter of the mirrors M1-M8, and $H_0$ is the maximum object height, as explained above. That is, $\phi_M$ is the diameter of the circle circumscribing the reflective region (usage region), centered on the optical axis, in the reflective mirror having a reflective region located farthest from the optical axis (i.e., the largest mirror).

$$\phi_M/H_0 \leq 5 \qquad (9)$$

If the upper limit of conditional Equation (9) is exceeded, the effective diameter $\phi_M$ of the largest reflective mirror is too large, which results in the optical system being too large diameter-wise. If $\phi_M$ is below the lower limit of conditional Equation (9), then in practice it is extremely difficult to design a reflective-type double-image-forming optical system having eight mirrors. As a practical matter, to manufacture mirrors with the prescribed precision and to avoid increasing the size of the optical system, regardless of the magnitude of $H_0$, it is desirable that $\phi_M$ of the largest reflective mirror be 700 mm or less. To prevent, even more satisfactorily, increases in the diameter-wise dimensions of the optical system, it is desirable that the upper limit in conditional Equation (9) be 4.

In yet another embodiment of the projection-optical system, the inclination $\alpha$ of the beam from the first surface to the first mirror M1 (with respect to the optical axis of the chief ray) satisfies the following conditional Equation (10).

$$5° < |\alpha| < 10° \qquad (10)$$

If the upper limit of conditional Equation (10) is exceeded, whenever a reflective mask is placed at the first surface, the effect of blocking of the reflected beam by the pattern of the absorbing bodies on the mask is too great, which is undesirable. If $|\alpha|$ falls below the lower limit of conditional Equation (10), whenever a reflective mask is placed at the first surface, light that is incident on the reflective mask cannot be separated from light reflected from the mask, which is undesirable.

In yet another embodiment of a projection-optical system, the respective reflective surfaces of each of the mirrors M1-M8 are aspherical, and have rotational symmetry about the optical axis. It is also desirable that the maximum order of asphericity stipulated for each reflective surface be 18th order or higher. By using these high-order aspherical surfaces, aberrations can be satisfactorily corrected, which provides improved optical performance. Aberrations can, to some extent, be satisfactorily corrected if the maximum order is 16th order; but, by imposing a maximum order of 18th or higher, still more complex and minute aspherical shapes can be represented, thereby making possible adequate aberration correction.

It is also desirable that the projection-optical system be substantially telecentric on the image side (second-surface side). With such a configuration, as used for example in an exposure apparatus, satisfactory image formation is possible within the focal depth of the projection-optical system even when there are depressions and protrusions on the wafer or of the wafer.

In the various projection-optical systems described above, an intermediate image is formed in the optical path between the fourth mirror M4 and the fifth mirror M5. But, due to the influence of aberrations and the like, a sharp intermediate image may not be formed. However, there is no need to form a sharp intermediate image; it is much more important to form a sharp final image on the second surface. If a foreign object or the like were to be in the vicinity of the intermediate-image position, if a sharp intermediate image is not formed, then the image of the foreign object on the second surface would be greatly blurred, which is a desirable situation. Therefore, it is better that a sharp intermediate image not be formed.

However, if the intermediate image is formed in extremely close proximity to the reflective surface of a mirror, a concern is that images of minute structures, adhering foreign objects, and the like on the reflective surface of the mirror may be superposed on the image projected onto the second surface. Moreover, the partial diameter (the effective diameter of the beam on the reflective surface) of the mirror may be too small, which may cause problems with respect to manufacturing tolerances. Hence, it is desirable that the optical system be configured to form the intermediate image at a position sufficiently distant from the reflective surfaces of the mirrors.

Figure 1:
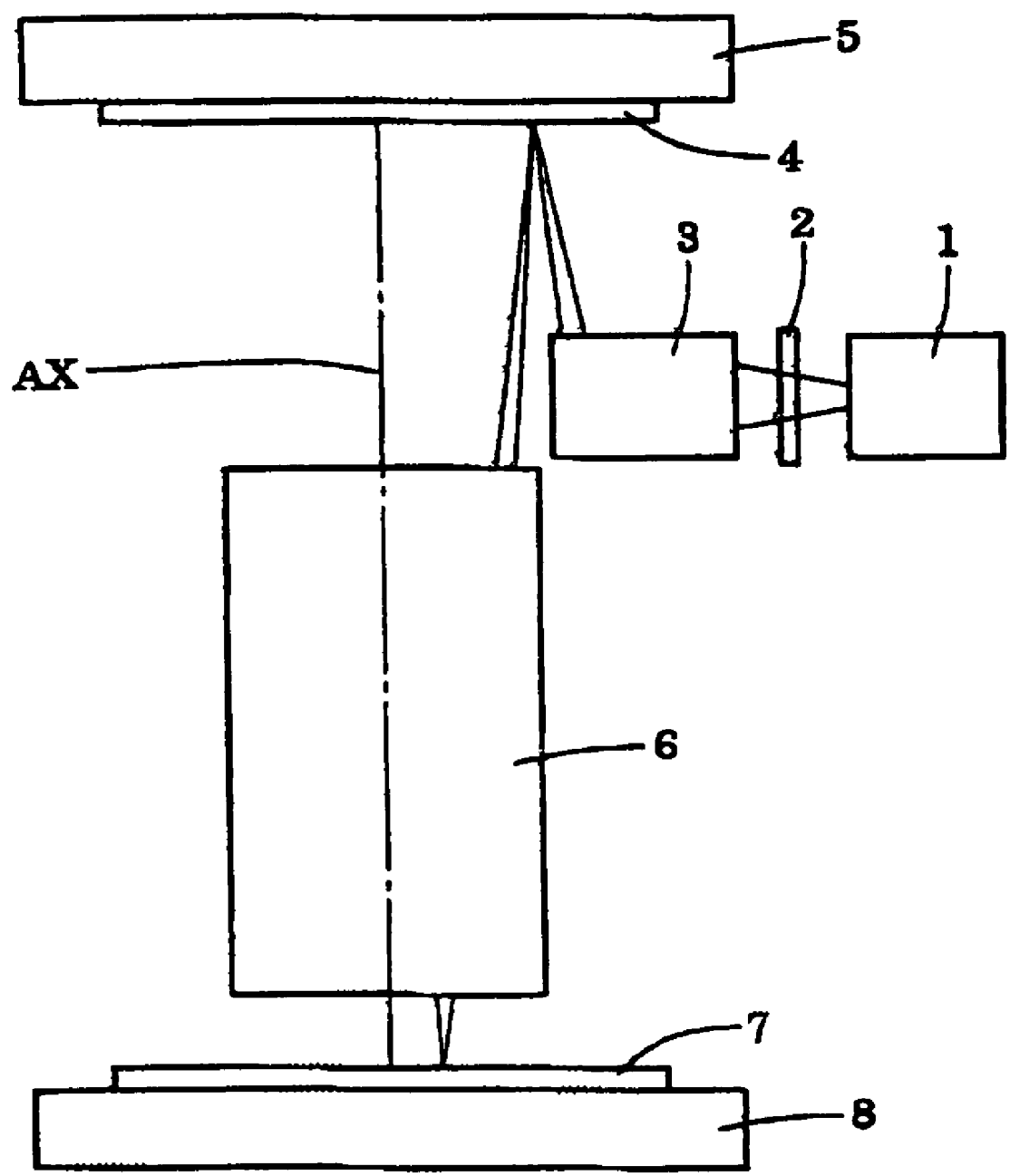
FIG. 1 is a schematic elevational view of an embodiment of an exposure apparatus including a projection-optical system as disclosed herein.
Figure 2:
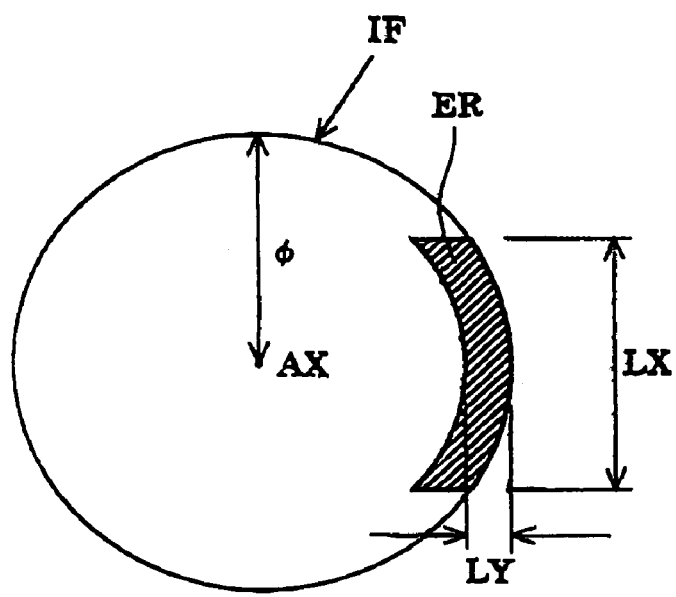
FIG. 2 is a plan view of the positional relationship between the arc-shaped effective image-formation region formed on the wafer and the optical axis.
Figure 2:
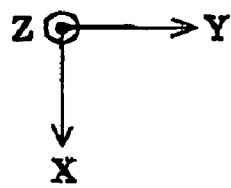

Various aspects are shown in the attached drawings, of which FIG. 1 summarizes an embodiment of an exposure apparatus, and FIG. 2 shows the positional relationship of the arc-shaped effective image-formation region, as formed on the wafer, to the optical axis. In FIG. 1, the Z-axis is in the optical-axis direction of the projection-optical system 6, that is, the direction normal to the wafer 7 serving as the photosensitive substrate. The Y-axis (in the wafer plane) is parallel to the plane of the paper in FIG. 1, and the X-axis (in the wafer plane) is perpendicular to the plane of the paper in FIG. 1.

The exposure apparatus shown in FIG. 1 comprises a laser-plasma X-ray source 1 serving as an exemplary light source of exposure light. A discharge-plasma source or other X-ray source can be used as the X-ray source. Light emitted from the X-ray source 1 passes through the wavelength-selection filter 2 and is incident on the illumination-optical system 3. Here, the wavelength-selection filter 2 transmits, of the light produced by the source 1, only X-rays of a prescribed wavelength (13.5 nm) and blocks light of other wavelengths. X-rays that have passed through the wavelength-selection filter 2 pass through the illumination-optical system 3, which comprises a plurality of reflective mirrors, to illuminate a reflection-type mask 4 on which is formed the pattern to be transferred. As an alternative to the wavelength-selection filter 2, a wavelength-selection film formed on a reflective mirror may be used, or other wavelength-selection means may be employed. Further alternatively, the wavelength-selection means can be omitted.

The mask 4 is held by a mask stage 5, movable along the Y-direction, such that the patterned surface of the mask extends along the XY plane. Movement of the mask stage 5 is measured by at least one laser interferometer (not shown). On the mask 4 is formed an arc-shaped illumination region that is symmetrical with respect to the Y-axis. Light from the illuminated mask 4 passes through the reflection-type projection-optical system 6, and forms an image of the mask pattern on the wafer 7 serving as the photosensitive substrate.

The effective image-formation region is arc-shaped and symmetrical with respect to the Y-axis, and is formed on the wafer 7 as shown in FIG. 2. Within the circular region (image circle) IF having a radius $\phi$ and centered on the optical axis AX, an effective arc-shaped image-formation region ER is established. The length of the arc-shaped region ER in the X-direction is LX and the length in the Y-direction is LY so as to be tangent to the image circle IF. Thus, the arc-shaped effective image-formation region ER is a portion of an annulus centered on the optical axis AX. The length LY is the width of the effective image-formation region ER along a direction connecting the center of the arc-shaped effective image-formation region ER with the optical axis.

The wafer 7 is held by a wafer stage 8 that is movable in two dimensions along the X-direction and Y-direction, such that the exposure plane extends in the XY plane. As with the mask stage 5, movement of the wafer stage is measured using at least one laser interferometer (not shown). Thus, while moving the mask stage 5 and the wafer stage 8 along the Y-direction, that is, while moving the mask 4 and wafer 7 along the Y-direction relative to the projection-optical system 6, scanning exposure is performed, by which the pattern of the mask 4 is transferred onto an exposure region of the wafer 7.

If the projection magnification (transfer magnification) of the projection-optical system 6 is ¼, synchronized scanning is performed with the movement velocity of the wafer stage 8 set to ¼ of the movement velocity of the mask stage 5. By repeating the scanning exposures while moving the wafer stage 8 in two dimensions along the X-direction and Y-direction, the pattern of the mask 4 is transferred sequentially to each of the exposure regions on the wafer 7. Below, exemplary configurations of a projection-optical system 6 are explained in the context of first, second, and third representative embodiments.

In each representative embodiment, the projection-optical system 6 comprises a first reflective image-forming optical system G1, to form an intermediate image of the pattern of the mask 4, and a second reflective image-forming optical system G2 to form a final reduced image of the pattern of the mask 4 (i.e., an image of the intermediate image) on the wafer 7. The intermediate image of the mask pattern is formed in the optical path between the first reflective image-forming optical system G1 and the second reflective image-forming optical system G2.

The first reflective image-forming optical system G1 comprises four reflective mirrors M1-M4, and the second reflective image-forming optical system G2 comprises four reflective mirrors M5-M8. In each of the representative embodiments, the respective reflective surfaces of all of the mirrors M1-M8 are aspherical and have rotational symmetry with respect to the optical axis. Also, the projection-optical system 6 is substantially telecentric on the wafer side (image side).

In each representative embodiment, an aspherical surface is represented by the following Equation (a), in which the height (in a direction perpendicular to the optical axis) is y, the distance along the optical axis from the tangent plane at the vertex of the aspherical surface to the position on the aspherical surface at height y (sag amount) is z, the vertex radius of curvature is r, the conical coefficient is $\kappa$, and the nth order aspheric coefficient is $C_n$.

$$z = (y^2/r) / \{1 + [1 - (1+\kappa) \cdot y^2/r^2]^{1/2}\} + \\ C_4 y^4 + C_6 y^6 + C_8 y^8 + C_{10} y^{10} + C_{12} y^{12} + \\ C_{14} y^{14} + C_{16} y^{16} + C_{18} y^{18} + C_{20} y^{20}$$ (a)

First Representative Embodiment

A projection-optical system according to this embodiment is depicted in FIG. 3, in which light from the mask 4 is reflected in succession by the concave reflective surface of the first mirror M1, the convex reflective surface of the second mirror M2, the concave reflective surface of the third mirror M3, and the concave reflective surface of the fourth mirror M4, after which an intermediate image I1 of the mask pattern is formed. The mirrors M1-M4 comprise the first reflective image-forming optical system G1. Light from the intermediate image I1, formed by the first reflective image-forming optical system G1, is reflected in succession by the concave reflective surface of the fifth mirror M5, the concave reflective surface of the sixth mirror M6, the convex reflective surface of the seventh mirror M7, and the concave reflective surface of the eighth mirror M8, after which a reduced image (second-order image) of the mask pattern is formed on the wafer 7. In this embodiment, an aperture stop (not shown) is situated in proximity to the reflective surface of the second mirror M2. The mirrors M5-M8 comprise the second reflective image-forming optical system G2

Various parameters for the projection-optical system of this first representative embodiment are listed in Table 1. In the Main Parameters section of the table, $\lambda$ is the wavelength of the exposure light, $\beta$ is the projection magnification, NA is the image-side (wafer-side) numerical aperture, $\phi$ is the radius of the image circle IF (maximum image height) on the wafer 7, LX is the length in the X-direction of the effective image-formation region ER, and LY is the length in the Y-direction of the effective image-formation region ER (i.e., the width dimension of the arc-shaped effective image-formation region ER). In the section of Table (1) listing conditional Equation corresponding values, $RM_i$ (i=1, 2, 3, 4, 5, 6, 7, 8) is the absolute value of the center radius of curvature of the reflective surface for the ith reflective mirror Mi, $H_0$ is the maximum object height on the mask 4, TT is the distance along the axis between the mask 4 and the wafer 7, and $\phi_M$ is the effective diameter of the largest reflective mirror.

The listed surface numbers indicate the order of the reflective surface from the mask side, along the direction of propagation of rays, from the mask surface (which is the object surface) to the wafer surface (which is the image surface); r is the vertex radius of curvature (center radius of curvature, in mm) for each reflective surface; and d is the interval (distance) along the axis between reflective surfaces, in mm. The sign of the surface interval d changes with each reflection. The radius of curvature of a surface that is convex facing the mask side is positive, regardless of the direction of incidence of rays, and the radius of curvature of a concave surface is negative. The above notation is similarly used for Table 2 and Table 3, below.

TABLE 1

Main Parameters $\lambda$ = 13.5 nm
$\beta$ = ¼
NA = 0.50
$\phi$ = 46.5 mm
LX = 26 mm
LY = 1 mm (Optical Member Parameters)

| Surface number | r | d | Optical member |
|---|---|---|---|
|  | (Mask surface) | 625.150 |  |
| 1 | −652.540 | −219.344 | (First reflective mirror M1) |
| 2 | −551.984 | 208.024 | (Second reflective mirror M2) |
| 3 | −1253.042 | −446.338 | (Third reflective mirror M3) |
| 4 | 1535.485 | 800.019 | (Fourth reflective mirror M4) |
| 5 | −810.693 | −137.103 | (Fifth reflective mirror M5) |
| 6 | 2539.855 | 186.723 | (Sixth reflective mirror M6) |
| 7 | 168.959 | −251.329 | (Seventh reflective mirror M7) |
| 8 | 311.342 | 291.329 | (Eighth reflective mirror M8) |
|  | (Wafer surface) |  |  |

Aspherical surface data

First surface:

$\kappa$ = 0.000000
$C_4$ = 0.584245 × 10$^{-9}$    $C_6$ = 0.208798 × 10$^{-14}$
$C_8$ = −0.158633 × 10$^{-18}$    $C_{10}$ = 0.611898 × 10$^{-23}$
$C_{12}$ = −0.157837 × 10$^{-27}$    $C_{14}$ = 0.303999 × 10$^{-32}$
$C_{16}$ = −0.647741 × 10$^{-37}$    $C_{18}$ = 0.129318 × 10$^{-41}$
$C_{20}$ = −0.647741 × 10$^{-46}$ Second surface:

$\kappa$ = 0.000000
$C_4$ = −0.694110 × 10$^{-8}$    $C_6$ = −0.601921 × 10$^{-12}$
$C_8$ = −0.647428 × 10$^{-17}$    $C_{10}$ = −0.323708 × 10$^{-19}$
$C_{12}$ = 0.229571 × 10$^{-22}$    $C_{14}$ = −0.106922 × 10$^{-25}$
$C_{16}$ = 0.294622 × 10$^{-29}$    $C_{18}$ = −0.106922 × 10$^{-33}$
$C_{20}$ = 0.294622 × 10$^{-37}$ Third surface:

$\kappa$ = 0.000000
$C_4$ = −0.326926 × 10$^{-8}$    $C_6$ = 0.192188 × 10$^{-13}$
$C_8$ = −0.158549 × 10$^{-18}$    $C_{10}$ = −0.370692 × 10$^{-23}$
$C_{12}$ = 0.286255 × 10$^{-27}$    $C_{14}$ = −0.947463 × 10$^{-32}$
$C_{16}$ = 0.181297 × 10$^{-36}$    $C_{18}$ = −0.191435 × 10$^{-41}$
$C_{20}$ = 0.867254 × 10$^{-47}$ Fourth surface:

$\kappa$ = 0.000000
$C_4$ = 0.375633 × 10$^{-9}$    $C_6$ = −0.80149 × 10$^{-13}$
$C_8$ = 0.359386 × 10$^{-17}$    $C_{10}$ = −0.113065 × 10$^{-21}$
$C_{12}$ = 0.238227 × 10$^{-26}$    $C_{14}$ = −0.333367 × 10$^{-31}$
$C_{16}$ = 0.294212 × 10$^{-36}$    $C_{18}$ = −0.146755 × 10$^{-41}$
$C_{20}$ = 0.307955 × 10$^{-47}$ Fifth surface:

$\kappa$ = 0.000000
$C_4$ = 0.503603 × 10$^{-9}$    $C_6$ = −0.420935 × 10$^{-13}$
$C_8$ = 0.333495 × 10$^{-18}$    $C_{10}$ = 0.957166 × 10$^{-23}$
$C_{12}$ = −0.320467 × 10$^{-27}$    $C_{14}$ = 0.414665 × 10$^{-32}$
$C_{16}$ = −0.262858 × 10$^{-37}$    $C_{18}$ = 0.656145 × 10$^{-43}$
$C_{20}$ = 0.160300 × 10$^{-49}$ Sixth surface:

$\kappa$ = 0.000000
$C_4$ = −0.408247 × 10$^{-8}$    $C_6$ = 0.262567 × 10$^{-13}$
$C_8$ = −0.273287 × 10$^{-17}$    $C_{10}$ = 0.168364 × 10$^{-21}$
$C_{12}$ = −0.555375 × 10$^{-26}$    $C_{14}$ = 0.930208 × 10$^{-31}$
$C_{16}$ = −0.395993 × 10$^{-36}$    $C_{18}$ = −0.942740 × 10$^{-41}$
$C_{20}$ = 0.103833 × 10$^{-45}$ TABLE 1-continued Seventh surface:

$\kappa$ = 0.000000
$C_4$ = −0.425207 × 10$^{-8}$    $C_6$ = 0.536593 × 10$^{-12}$
$C_8$ = 0.186158 × 10$^{-15}$    $C_{10}$ = −0.115697 × 10$^{-18}$
$C_{12}$ = 0.622805 × 10$^{-22}$    $C_{14}$ = −0.278179 × 10$^{-25}$
$C_{16}$ = 0.763038 × 10$^{-29}$    $C_{18}$ = −0.115964 × 10$^{-32}$
$C_{20}$ = 0.725606 × 10$^{-37}$ Eighth surface:

$\kappa$ = 0.000000
$C_4$ = 0.980805 × 10$^{-10}$    $C_6$ = 0.236830 × 10$^{-14}$
$C_8$ = 0.338278 × 10$^{-19}$    $C_{10}$ = −0.235376 × 10$^{-24}$
$C_{12}$ = 0.466088 × 10$^{-28}$    $C_{14}$ = −0.179039 × 10$^{-32}$
$C_{16}$ = 0.474139 × 10$^{-37}$    $C_{18}$ = −0.657220 × 10$^{-42}$
$C_{20}$ = 0.415655 × 10$^{-47}$ Conditional equation values $RM_2$ = 552.0 mm
$RM_1$ = 652.5 mm
$RM_4$ = 1535.5 mm
$RM_8$ = 311.3 mm
$RM_3$ = 1253.0 mm
$RM_7$ = 169.0 mm
$RM_5$ = 810.7 mm
$RM_6$ = 2539.9 mm
$H_0$ = 184 mm
TT = 1057.1 mm
$\phi_M$ = 510.0 mm (maximum for fifth mirror M5)
(1) $RM_2/H_0$ = 3.0
(2) $RM_1/H_0$ = 3.5
(3) $RM_4/H_0$ = 8.3
(4) $RM_8/H_0$ = 1.7
(5) $RM_3/H_0$ = 6.8
(6) $RM_7/H_0$ = 0.9
(7) $RM_5/H_0$ = 4.4; $RM_6/H_0$ = 13.8
(8) $TT/H_0$ = 5.7
(9) $\phi_M/H_0$ = 2.77
(10) $|\alpha|$ = 7.85°

Figure 4:
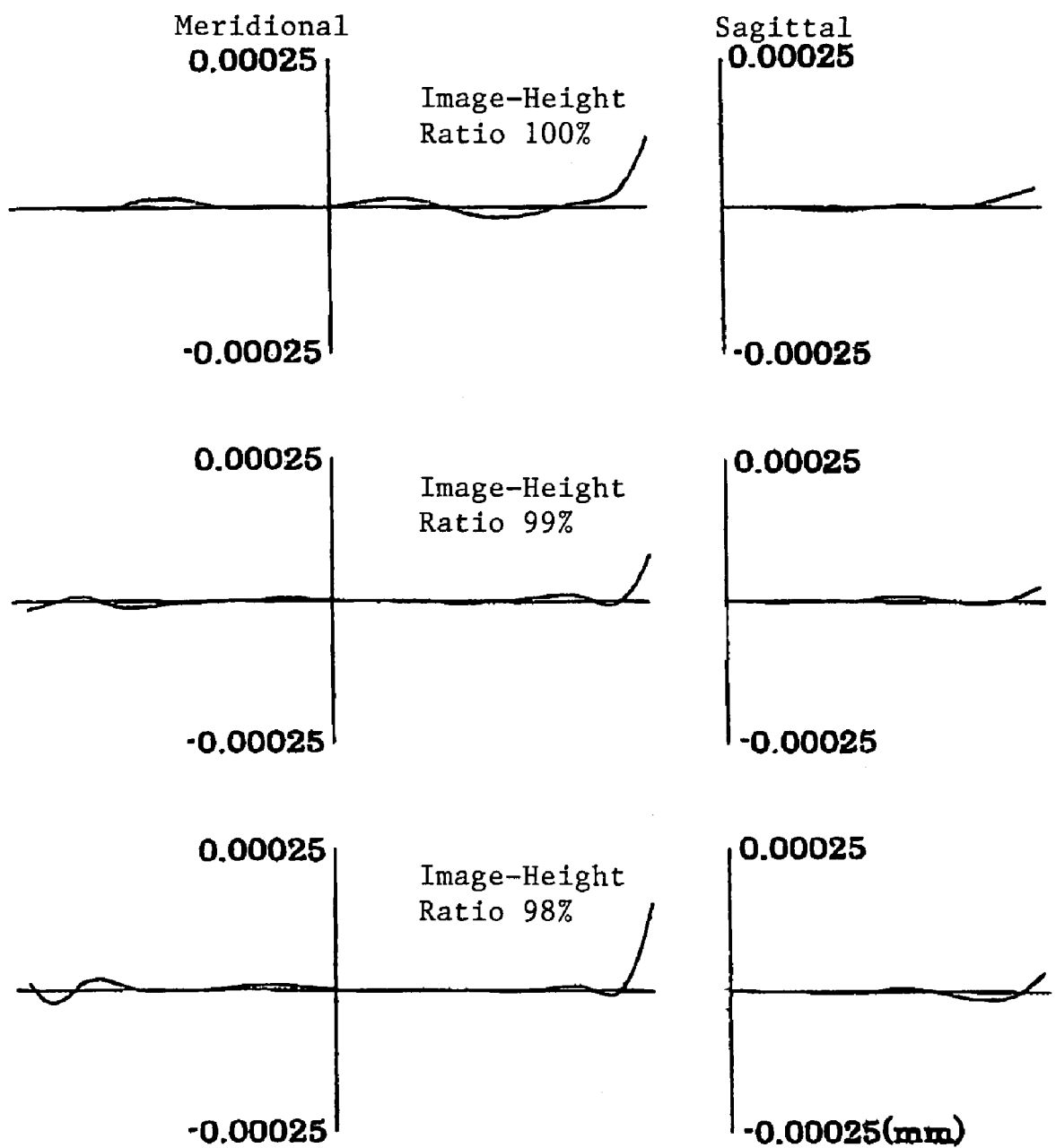
FIG. 4 shows plots of coma aberration exhibited by the first embodiment of a projection-optical system.

FIG. 4 shows coma aberration in the projection-optical system of the first representative embodiment. In FIG. 4 the meridional coma aberration and sagittal coma aberration are shown at image heights of 100%, 99%, and 98%. As is clear from the aberration diagrams of the first representative embodiment, coma aberration is satisfactorily corrected in the region corresponding to the effective image-formation region ER. Although not shown in the figure, it was confirmed that, in the region corresponding to the effective image-formation region ER, aberrations other than coma aberration, such as spherical aberration and distortion, were also satisfactorily corrected.

Second Representative Embodiment

Figure 5:
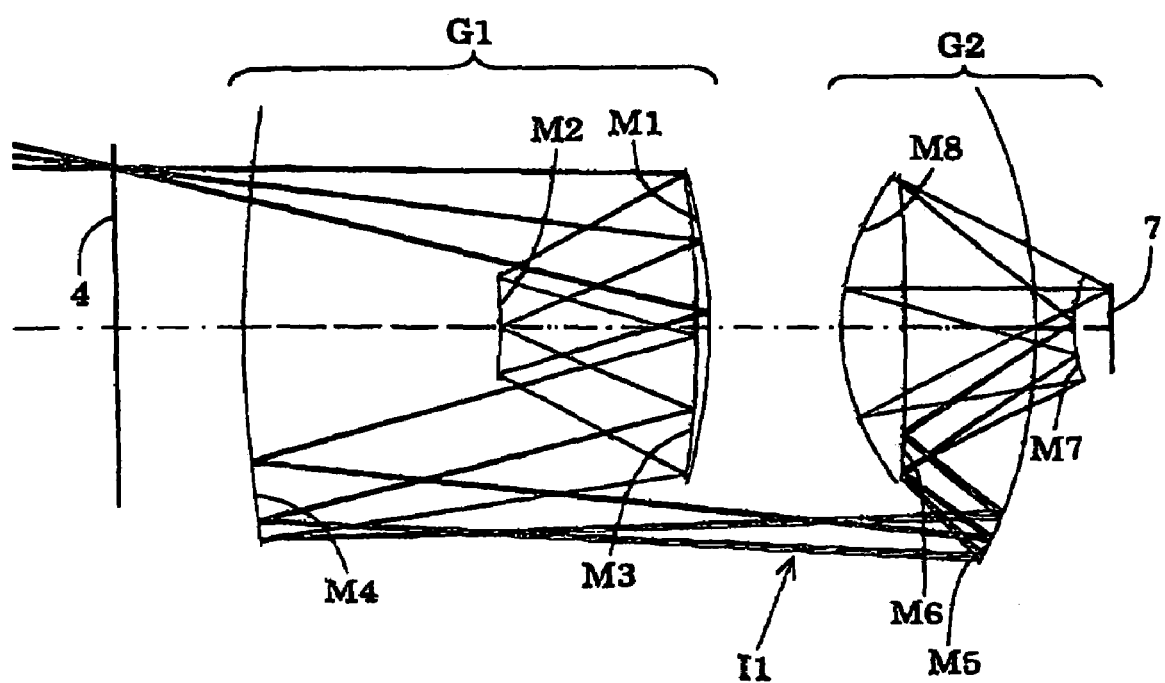
FIG. 5 is an optical diagram of a second embodiment of a projection-optical system.

A projection-optical system according to this embodiment is shown in FIG. 5, in which light from the mask 4 is reflected in succession by the concave reflective surface of the first mirror M1, the convex reflective surface of the second mirror M2, the concave reflective surface of the third mirror M3, and the concave reflective surface of the fourth mirror M4, after which an intermediate image I1 of the mask pattern is formed. Light from the intermediate image I1 formed by the first reflective image-forming optical system G1 is then reflected in succession by the concave reflective surface of the fifth mirror M5, the convex reflective surface of the sixth mirror M6, the convex reflective surface of the seventh mirror M7, and the concave reflective surface of the eighth mirror M8, after which a reduced image (second-order image) of the mask pattern is formed on the wafer 7. In the second representative embodiment, similarly to the first representative embodiment, an aperture stop (not shown) is situated in proximity to the reflective surface of the second mirror M2. Various parameters for the projection-optical system of the second representative embodiment appear in Table 2.

TABLE 2

Main Parameters $\lambda = 13.5$ nm
$\beta = \frac{1}{4}$
NA = 0.50
$\phi = 46.5$ mm
LX = 26 mm
LY = 1 mm (Optical Member Parameters)

| Surface number | r | d | Optical member |
|---|---|---|---|
| | (Mask surface) | 628.124 | |
| 1 | −652.540 | −220.838 | (First reflective mirror M1) |
| 2 | −564.071 | 208.46 | (Second reflective mirror M2) |
| 3 | −1329.047 | −481.384 | (Third reflective mirror M3) |
| 4 | 1605.523 | 839.331 | (Fourth reflective mirror M4) |
| 5 | −644.426 | −137.903 | (Fifth reflective mirror M5) |
| 6 | −5157.947 | 177.512 | (Sixth reflective mirror M6) |
| 7 | 178.008 | −245.177 | (Seventh reflective mirror M7) |
| 8 | 305.619 | 285.177 | (Eighth reflective mirror M8) |
| | (Wafer surface) | | |

Aspherical surface data

First surface:

$\kappa = 0.000000$
$C_4 = 0.706787 \times 10^{-9}$     $C_6 = -0.355545 \times 10^{-14}$
$C_8 = 0.438566 \times 10^{-19}$     $C_{10} = 0.138331 \times 10^{-23}$
$C_{12} = -0.131095 \times 10^{-27}$  $C_{14} = 0.571619 \times 10^{-32}$
$C_{16} = -0.165006 \times 10^{-36}$  $C_{18} = 0.282133 \times 10^{-41}$
$C_{20} = -0.209699 \times 10^{-46}$ Second surface:

$\kappa = 0.000000$
$C_4 = -0.821149 \times 10^{-8}$     $C_6 = -0.635882 \times 10^{-12}$
$C_8 = -0.504313 \times 10^{-17}$    $C_{10} = -0.347148 \times 10^{-19}$
$C_{12} = 0.232565 \times 10^{-22}$  $C_{14} = -0.104094 \times 10^{-25}$
$C_{16} = 0.278049 \times 10^{-29}$  $C_{18} = -0.412942 \times 10^{-33}$
$C_{20} = 0.261247 \times 10^{-37}$ Third surface:

$\kappa = 0.000000$
$C_4 = -0.302605 \times 10^{-8}$     $C_6 = 0.164746 \times 10^{-13}$
$C_8 = -0.139208 \times 10^{-18}$    $C_{10} = -0.136879 \times 10^{-23}$
$C_{12} = 0.988613 \times 10^{-28}$  $C_{14} = -0.169506 \times 10^{-32}$
$C_{16} = -0.100826 \times 10^{-37}$ $C_{18} = 0.715915 \times 10^{-42}$
$C_{20} = -0.696229 \times 10^{-47}$ Fourth surface:

$\kappa = 0.000000$
$C_4 = 0.111630 \times 10^{-8}$     $C_6 = -0.111234 \times 10^{-12}$
$C_8 = 0.456366 \times 10^{-17}$    $C_{10} = -0.129988 \times 10^{-21}$
$C_{12} = 0.252378 \times 10^{-26}$ $C_{14} = -0.331444 \times 10^{-31}$
$C_{16} = 0.281545 \times 10^{-36}$ $C_{18} = -0.139853 \times 10^{-41}$
$C_{20} = 0.307955 \times 10^{-47}$ Fifth surface:

$\kappa = 0.000000$
$C_4 = 0.203110 \times 10^{-8}$     $C_6 = -0.567843 \times 10^{-13}$
$C_8 = 0.237205 \times 10^{-18}$    $C_{10} = 0.137824 \times 10^{-22}$
$C_{12} = -0.329224 \times 10^{-27}$ $C_{14} = 0.340960 \times 10^{-32}$
$C_{16} = -0.174722 \times 10^{-37}$ $C_{18} = 0.338299 \times 10^{-43}$
$C_{20} = 0.160300 \times 10^{-49}$ Sixth surface:

$\kappa = 0.000000$
$C_4 = -0.287245 \times 10^{-8}$    $C_6 = -0.640909 \times 10^{-13}$
$C_8 = 0.723576 \times 10^{-18}$    $C_{10} = 0.129446 \times 10^{-21}$
$C_{12} = -0.660514 \times 10^{-26}$ $C_{14} = 0.105061 \times 10^{-30}$ TABLE 2-continued $C_{16} = 0.913044 \times 10^{-36}$  $C_{18} = -0.485627 \times 10^{-40}$
$C_{20} = 0.436135 \times 10^{-45}$ Seventh surface:

$\kappa = 0.000000$
$C_4 = -0.552920 \times 10^{-8}$    $C_6 = 0.116581 \times 10^{-11}$
$C_8 = 0.114751 \times 10^{-15}$    $C_{10} = -0.165550 \times 10^{-18}$
$C_{12} = 0.959472 \times 10^{-22}$ $C_{14} = -0.396272 \times 10^{-25}$
$C_{16} = 0.100497 \times 10^{-28}$ $C_{18} = -0.143414 \times 10^{-32}$
$C_{20} = 0.857681 \times 10^{-37}$ Eighth surface:

$\kappa = 0.000000$
$C_4 = 0.156200 \times 10^{-9}$     $C_6 = 0.315075 \times 10^{-14}$
$C_8 = 0.493706 \times 10^{-19}$    $C_{10} = -0.633915 \times 10^{-24}$
$C_{12} = 0.870621 \times 10^{-28}$ $C_{14} = -0.349516 \times 10^{-32}$
$C_{16} = 0.943345 \times 10^{-37}$ $C_{18} = -0.135266 \times 10^{-41}$
$C_{20} = 0.871327 \times 10^{-47}$ Conditional equation values $RM_2$ = 564.1 mm
$RM_1$ = 652.5 mm
$RM_4$ = 1605.5 mm
$RM_8$ = 305.6 mm
$RM_3$ = 1329.0 mm
$RM_7$ = 178.0 mm
$RM_5$ = 644.4 mm
$RM_6$ = 5157.9 mm
$H_0$ = 184 mm
TT = 1053.3 mm
$\phi_M$ = 540.0 mm (maximum for the fifth mirror M5)
(1) $RM_2/H_0$ = 3.1
(2) $RM_1/H_0$ = 3.5
(3) $RM_4/H_0$ = 8.7
(4) $RM_8/H_0$ = 1.7
(5) $RM_3/H_0$ = 7.2
(6) $RM_7/H_0$ = 1.0
(7) $RM_5/H_0$ = 3.5; $RM_6/H_0$ = 28.0
(8) $TT/H_0$ = 5.7
(9) $\phi_M/H_0$ = 2.93
(10) $|\alpha|$ = 7.76°

Figure 6:
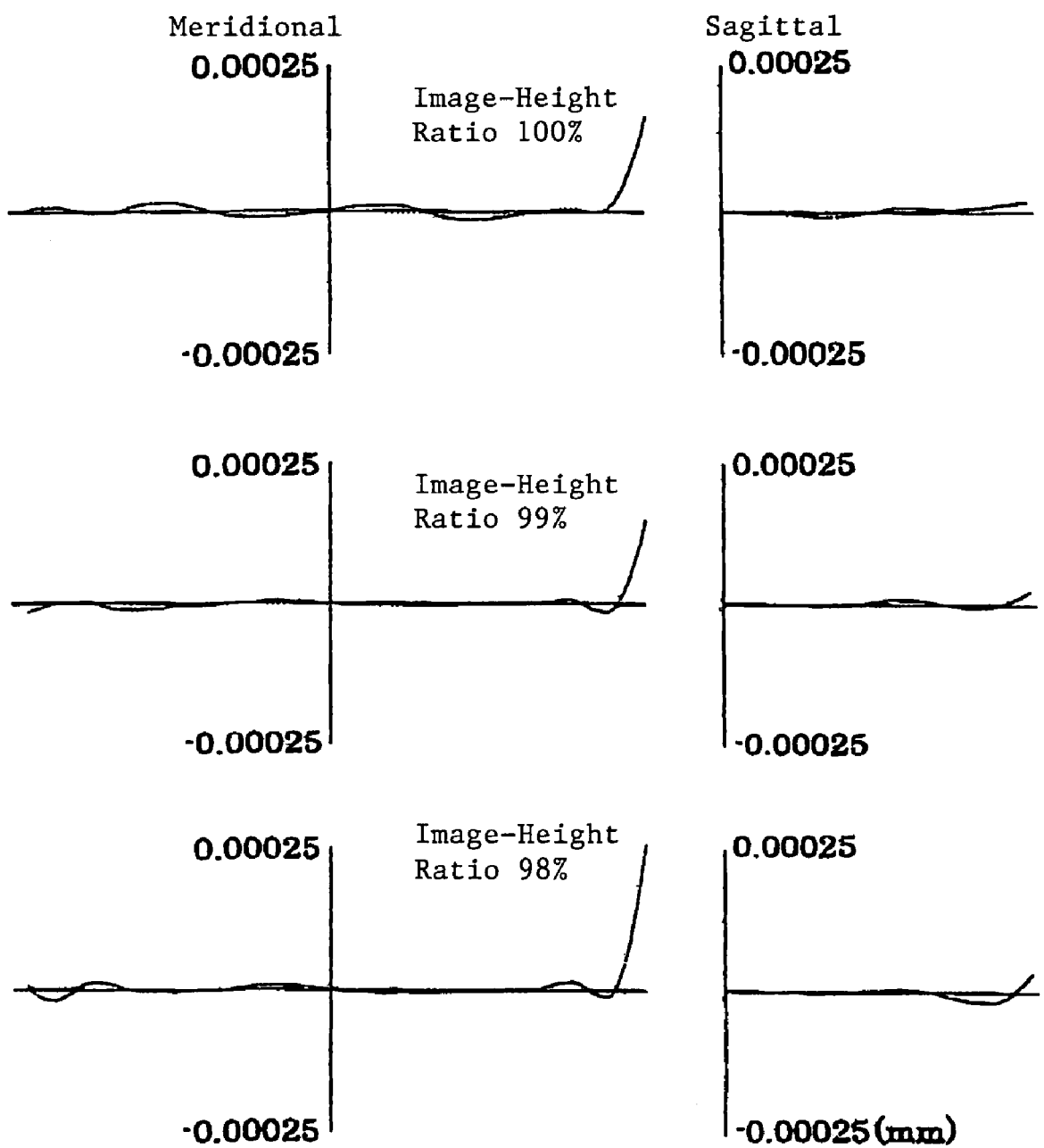
FIG. 6 shows plots of coma aberration exhibited by the second embodiment of a projection-optical system.

FIG. 6 shows coma aberration in the projection-optical system of the second representative embodiment, in which the meridional coma aberration and sagittal coma aberration are shown at image heights of 100%, 99%, and 98%. As is clear from the aberration diagram, in this second representative embodiment (similarly to the first representative embodiment), coma aberration is satisfactorily corrected in the region corresponding to the effective image-formation region ER. Although not shown in the figure, it was confirmed that, in the region corresponding to the effective image-formation region ER, aberrations other than coma aberration, such as spherical aberration and distortion, were also satisfactorily corrected.

Third Representative Embodiment

Figure 7:
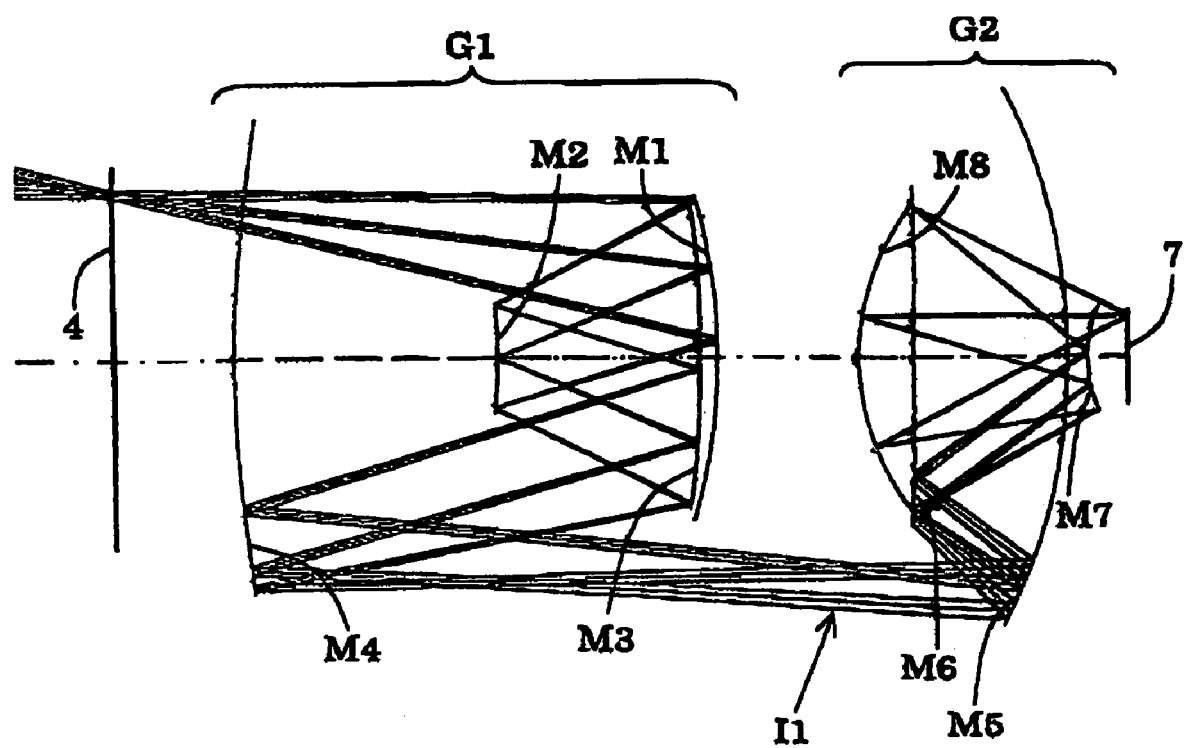
FIG. 7 is an optical diagram of a third embodiment of a projection-optical system.

A projection-optical system according to this embodiment is shown in FIG. 7, in which light from the mask 4 is reflected in succession by the concave reflective surface of the first mirror M1, the convex reflective surface of the second mirror M2, the concave reflective surface of the third mirror M3, and the concave reflective surface of the fourth mirror M4, after which an intermediate image I1 of the mask pattern is formed. Light from the intermediate image I1, formed by the first reflective image-forming optical system G1, is then reflected in succession by the concave reflective surface of the fifth mirror M5, the concave reflective surface of the sixth mirror M6, the convex reflective surface of the seventh mirror M7, and the concave reflective surface of the eighth mirror M8, after which a reduced image (second-order image) of the mask pattern is formed on the wafer 7. In the third representative embodiment, similarly to the first embodiment, an aperture stop (not shown) is situated in proximity to the reflective surface of the second mirror M2. Various parameters for this embodiment appear in the following Table 3.

TABLE 3

Main Parameters $\lambda = 13.5$ nm
$\beta = \frac{1}{4}$
$NA = 0.5$
$\phi = 46$ mm
$LX = 26$ mm
$LY = 2$ mm (Optical Member Parameters)

| Surface number | r | d | Optical member |
|---|---|---|---|
|  | (Mask surface) | 600.393 |  |
| 1 | −652.540 | −217.457 | (First reflective mirror M1) |
| 2 | −668.048 | 200.438 | (Second reflective mirror M2) |
| 3 | −1708.233 | −463.373 | (Third reflective mirror M3) |
| 4 | 1493.712 | 831.021 | (Fourth reflective mirror M4) |
| 5 | −684.540 | −153.552 | (Fifth reflective mirror M5) |
| 6 | 14597.26 | 172.552 | (Sixth reflective mirror M6) |
| 7 | 162.828 | −229.555 | (Seventh reflective mirror M7) |
| 8 | 287.177 | 269.555 | (Eighth reflective mirror M8) |
|  | (Wafer surface) |  |  |

Aspherical surface data

Figure 8:
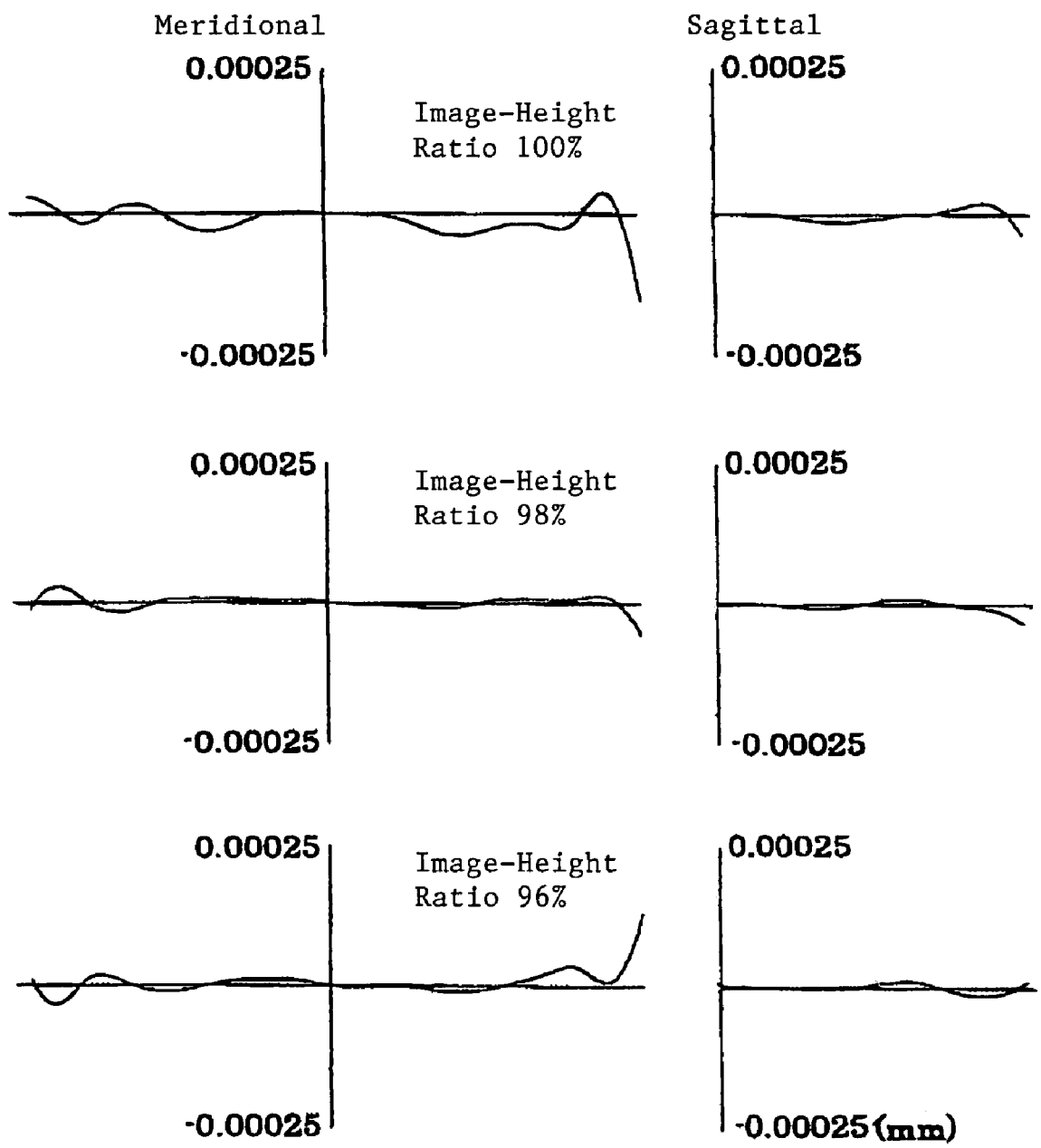
FIG. 8 shows plots of coma aberration exhibited by the third embodiment of a projection-optical system.

First surface:

$\kappa = 0.000000$
$C_4 = 0.815486 \times 10^{-9}$      $C_6 = -0.771041 \times 10^{-14}$
$C_8 = 0.315093 \times 10^{-18}$     $C_{10} = -0.185969 \times 10^{-22}$
$C_{12} = 0.114385 \times 10^{-26}$  $C_{14} = -0.515976 \times 10^{-31}$
$C_{16} = 0.146112 \times 10^{-35}$  $C_{18} = -0.231312 \times 10^{-40}$
$C_{20} = 0.156109 \times 10^{-45}$ Second surface:

$\kappa = 0.000000$
$C_4 = -0.751712 \times 10^{-8}$     $C_6 = -0.641820 \times 10^{-12}$
$C_8 = 0.341678 \times 10^{-16}$     $C_{10} = -0.765063 \times 10^{-19}$
$C_{12} = 0.508324 \times 10^{-22}$  $C_{14} = -0.218304 \times 10^{-25}$
$C_{16} = 0.565970 \times 10^{-29}$  $C_{18} = -0.816766 \times 10^{-33}$
$C_{20} = 0.502534 \times 10^{-37}$ Third surface:

$\kappa = 0.000000$
$C_4 = -0.401831 \times 10^{-8}$     $C_6 = 0.282286 \times 10^{-13}$
$C_8 = -0.379161 \times 10^{-18}$    $C_{10} = 0.121166 \times 10^{-22}$
$C_{12} = -0.939522 \times 10^{-27}$ $C_{14} = 0.525369 \times 10^{-31}$
$C_{16} = -0.172057 \times 10^{-35}$ $C_{18} = 0.304982 \times 10^{-40}$
$C_{20} = -0.227398 \times 10^{-45}$ Fourth surface:

$\kappa = 0.000000$
$C_4 = 0.122356 \times 10^{-8}$      $C_6 = -0.116379 \times 10^{-12}$
$C_8 = 0.469731 \times 10^{-17}$     $C_{10} = -0.131944 \times 10^{-21}$
$C_{12} = 0.253536 \times 10^{-26}$  $C_{14} = -0.330901 \times 10^{-31}$
$C_{16} = 0.280483 \times 10^{-36}$  $C_{18} = -0.139493 \times 10^{-41}$
$C_{20} = 0.307955 \times 10^{-47}$ Fifth surface:

$\kappa = 0.000000$
$C_4 = 0.244437 \times 10^{-8}$      $C_6 = -0.587622 \times 10^{-13}$
$C_8 = 0.141326 \times 10^{-18}$     $C_{10} = 0.155703 \times 10^{-22}$
$C_{12} = -0.331996 \times 10^{-27}$ $C_{14} = 0.321421 \times 10^{-32}$
$C_{16} = -0.155252 \times 10^{-37}$ $C_{18} = 0.279305 \times 10^{-43}$
$C_{20} = 0.160300 \times 10^{-49}$ Sixth surface:

$\kappa = 0.000000$
$C_4 = -0.367157 \times 10^{-8}$     $C_6 = -0.140514 \times 10^{-13}$
$C_8 = -0.626104 \times 10^{-18}$    $C_{10} = 0.101996 \times 10^{-21}$ TABLE 3-continued $C_{12} = -0.436263 \times 10^{-26}$  $C_{14} = 0.890836 \times 10^{-31}$
$C_{16} = -0.716472 \times 10^{-36}$  $C_{18} = -0.272024 \times 10^{-41}$
$C_{20} = 0.587507 \times 10^{-46}$ Seventh surface:

$\kappa = 0.000000$
$C_4 = -0.596482 \times 10^{-8}$     $C_6 = 0.217159 \times 10^{-11}$
$C_8 = -0.220909 \times 10^{-15}$    $C_{10} = 0.116463 \times 10^{-18}$
$C_{12} = -0.106620 \times 10^{-21}$ $C_{14} = 0.502113 \times 10^{-25}$
$C_{16} = -0.142880 \times 10^{-28}$ $C_{18} = 0.219102 \times 10^{-32}$
$C_{20} = -0.146021 \times 10^{-36}$ Eighth surface:

$\kappa = 0.000000$
$C_4 = 0.181123 \times 10^{-9}$      $C_6 = 0.416886 \times 10^{-14}$
$C_8 = 0.790184 \times 10^{-19}$     $C_{10} = -0.152348 \times 10^{-23}$
$C_{12} = 0.190606 \times 10^{-27}$  $C_{14} = -0.812124 \times 10^{-32}$
$C_{16} = 0.229532 \times 10^{-36}$   $C_{18} = -0.344302 \times 10^{-41}$
$C_{20} = 0.233892 \times 10^{-46}$ Conditional equation values $RM_2 = 668.0$ mm
$RM_1 = 652.5$ mm
$RM_4 = 1493.7$ mm
$RM_8 = 287.2$ mm
$RM_3 = 1708.2$ mm
$RM_7 = 162.8$ mm
$RM_5 = 684.5$ mm
$RM_6 = 14597.3$ mm
$H_0 = 180$ mm
$TT = 1011.0$ mm
$\phi_M = 571.3$ mm (maximum for the fifth mirror M5)
(1) $RM_2/H_0 = 3.7$
(2) $RM_1/H_0 = 3.6$
(3) $RM_4/H_0 = 8.3$
(4) $RM_8/H_0 = 1.6$
(5) $RM_3/H_0 = 9.5$
(6) $RM_7/H_0 = 0.9$
(7) $RM_5/H_0 = 3.8$; $RM_6/H_0 = 81.1$
(8) $TT/H_0 = 5.6$
(9) $\phi_M/H_0 = 3.17$
(10) $|\alpha| = 7.97°$ FIG. 8 shows coma aberration in the projection-optical system of this embodiment. In FIG. 8, the meridional coma aberration and sagittal coma aberration are shown at image heights of 100%, 98%, and 96%. As is clear from the aberration diagram, in this embodiment (as in first and second representative embodiments), coma aberration is satisfactorily corrected in the region corresponding to the effective image-formation region ER. Although not shown in the figure, it was confirmed that, in the region corresponding to the effective image-formation region ER, aberrations other than coma aberration, such as spherical aberration and distortion, were also satisfactorily corrected.

In each of the embodiments detailed above, a comparatively large image-side numerical aperture of 0.5 is provided for X-rays of wavelength 13.5 nm. In addition, an arc-shaped effective image-formation region of 26 mm×2 mm or 26 mm×1 mm, in which various aberrations are satisfactorily corrected, is provided on the wafer 7. Hence, in an exposure region of 26 mm×33 mm on the wafer 7, scanning exposure can be performed to transfer the pattern of the mask 4 with a high resolution of 0.1 μm or less.

In the various embodiments the effective diameter of the fifth (concave) mirror M5, which is the largest mirror, is approximately 510 mm to approximately 570 mm. Thus, M5 is kept sufficiently small compared to conventional reflective projection-optical systems. Thus, each of these embodiments represents a relatively compact optical system, which allows performance of measurements and machining with high precision during the manufacture of the mirrors. Also, the inclination of the chief ray in these embodiments is substantially zero over the entire arc-shaped effective image-formation region ER, thereby providing optical systems that are substantially telecentric on the image side.

In the various embodiments, the angle α made by the ray group incident on the mask 4 and the ray group reflected by the mask 4, relative to the optical axis AX, can be kept small, at approximately 7.8° to approximately 8.0°. Consequently, even if a reflective mask 4 is used, the incident and reflected lights can be separated, and blockage of the reflected beam by the pattern of absorbing bodies on the mask can be reduced, thereby preserving good optical performance. In addition, large changes in image magnification do not tend to result from slight errors in the installed position of the mask 4.

Figure 9:
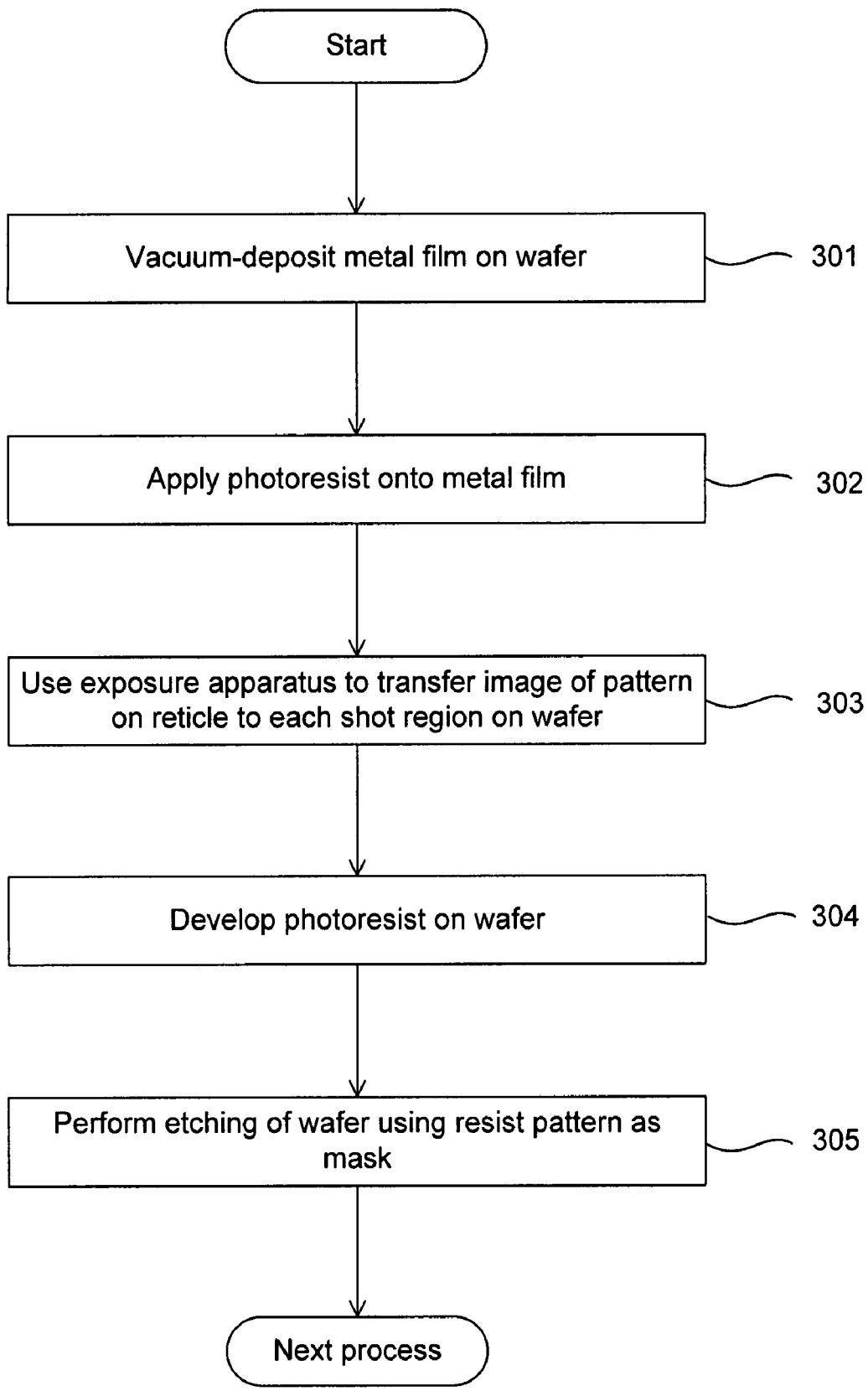
FIG. 9 is a flow-chart of an exemplary method for fabricating micro-devices, such as semiconductor devices, using an exposure apparatus as disclosed herein.

In exposure apparatus as described herein, a mask is illuminated by an illumination-optical system (illumination process), and a projection-optical system is used to expose a pattern, defined on the mask, onto a photosensitive substrate so as to transfer the pattern (exposure process). In this manner, microdevices (e.g., semiconductor devices, image-capture elements, liquid-crystal-display devices, thin-film magnetic heads, and the like) can be manufactured. An example of a method for fabricating semiconductor devices (as exemplary microdevices) by forming prescribed circuit patterns on a wafer or other photosensitive substrate using an exposure apparatus as disclosed herein is shown in FIG. 9. In step 301 of FIG. 9, a metal film is formed by vacuum deposition on a lot of wafers. In the step 302, a photoresist is applied to the metal film on the wafers. In step 303, exposure apparatus as described herein is used for transfer-exposing, in each of the "shot" regions on the wafers, an image of the pattern on a mask (reticle), via the projection-optical system. In step 304 the photoresist is developed. In step 305, etching of the wafers is performed, using the resist pattern as a mask, to form a circuit pattern corresponding to the pattern on the mask in each of the shot regions on each wafer. By further forming circuit patterns in successive layers, semiconductor devices or other devices are manufactured. By means of this device-manufacturing method, semiconductor devices having extremely fine circuit patterns can be obtained with good throughput.

In certain embodiments described above, a laser-plasma X-ray source is used as a light source to supply X-rays for exposure. However, it will be understood that any of various other sources may be employed. For example, X-rays can be produced from synchrotron radiation (SOR).

Although the embodiments have been described in connection with exposure apparatus of which the source produces X-rays as exposure light, it will be understood that the embodiments are not limited to X-ray sources. Various aspects of the invention are also applicable to exposure equipment of which the light source provides exposure light at wavelengths other than X-ray wavelengths.

Although the embodiments have been described in connection with projection-optical systems as used in exposure apparatus, it will be understood that that various aspects of the invention can be applied to other projection-optical systems in general.

What is claimed is:

1. A projection-optical system that forms, on a second surface, a reduced image of a first surface, the system comprising:
a first reflective image-forming optical system situated and configured to form an intermediate image of the first surface, based on light from the first surface;
a second reflective image-forming optical system situated and configured to form the reduced image on the second surface, based on light from the intermediate image;
the first reflective image-forming optical system comprising, in order of light incidence from the first surface, a first reflective mirror having a concave reflective surface, a second reflective mirror having a convex reflective surface, a third reflective mirror, and a fourth reflective mirror having a concave reflective surface;
the second reflective image-forming optical system comprising, in order of light incidence from the intermediate image, a fifth reflective mirror having a concave reflective surface, a sixth reflective mirror, a seventh reflective mirror having a convex reflective surface, and an eighth reflective mirror having a concave reflective surface; and
satisfying conditions $1<RM_2/H_0<6$ and $4<RM_3/H_0<13$, wherein $RM_2$ is the absolute value of a center radius of curvature of the reflective surface of the second mirror, $RM_3$ is the absolute value of a center radius of curvature of the reflective surface of the third mirror, and $H_0$ is a maximum object height on the first surface.

2. The projection-optical system of claim 1, further satisfying a condition $1<RM_1/H_0<6$, wherein $RM_1$ is the absolute value of a center radius of curvature of the reflective surface of the first mirror.

3. The projection-optical system of claim 1, further satisfying a condition $4<RM_4/H_0<12$, wherein $RM_4$ is the absolute value of a center radius of curvature of the reflective surface of the fourth mirror.

4. The projection-optical system of claim 1, further satisfying a condition $0.1<RM_8/H_0<4$, wherein $RM_8$ is the absolute value of a center radius of curvature of the reflective surface of the eighth mirror.

5. The projection-optical system of claim 1, wherein the third mirror has a concave reflective surface.

6. The projection-optical system of claim 1, further satisfying a condition $0.1<RM_7/H_0<3$, wherein $RM_7$ is the absolute value of a center radius of curvature of the reflective surface of the seventh mirror.

7. The projection-optical system of claim 1, further satisfying a condition $4<TT/H_0<8$, wherein TT is an interval on the optical axis between the first surface and the second surface.

8. The projection-optical system of claim 1, further comprising an aperture stop situated at, or in proximity to, the reflective surface of the second mirror.

9. The projection-optical system of claim 1, having a numerical aperture, on the side of the second surface, that is larger than 0.45.

10. The projection-optical system of claim 1, configured to form a reduced image in an arc-shaped effective image-formation region on the second surface, wherein the arc-shaped effective image-formation region has a width greater than 0.5 mm.

11. The projection-optical system of claim 1, further satisfying a condition $\phi_M/H_0 \leq 5$, wherein $\phi_M$ is an effective radius of each of the eight mirrors.

12. The projection-optical system of claim 1, further satisfying a condition $5°<|\alpha|<10°$, wherein α is an inclination, relative to the optical axis, of the chief ray from the first surface to the first mirror.

13. The projection-optical system of claim 1, further satisfying a condition $RM_{1-8}/H_0 \leq 12$, wherein $RM_{1-8}$ is, in seven of the eight reflective mirrors, the absolute value of a center radius of curvature of the reflective surface of the respective mirror.

14. The projection-optical system of claim 1, further satisfying at least one additional condition selected from the group consisting of:

$1 < RM_1/H_0 < 6$ $4 < RM_4/H_0 < 12$ $0.1 < RM_8/H_0 < 4$ $4 < RM_3/H_0 < 13$ $0.1 < RM_7/H_0 < 3$ $4 < TT/H_0 < 8$ wherein $RM_1$ is the absolute value of a center radius of curvature of the reflective surface of the first mirror, $RM_4$ is the absolute value of a center radius of curvature of the reflective surface of the fourth mirror, $RM_8$ is the absolute value of a center radius of curvature of the reflective surface of the eighth mirror, $RM_3$ is the absolute value of a center radius of curvature of the reflective surface of the third mirror, $RM_7$ is the absolute value of a center radius of curvature of the reflective surface of the seventh mirror, and TT is an interval on the optical axis between the first surface and the second surface.

15. The projection-optical system of claim 14, having a numerical aperture, on the side of the second surface, that is larger than 0.45.

16. The projection-optical system of claim 14, configured to form a reduced image in an arc-shaped effective image-formation region on the second surface, wherein the arc-shaped effective image-formation region has a width greater than 0.5 mm.

17. The projection-optical system of claim 14, further satisfying at least one additional condition selected from the group consisting of:

$\phi_M/H_0 \leq 5$ $5° < |\alpha| < 10°$ $RM_{1-8}/H_0 \leq 12$ wherein $\phi_M$ is an effective radius of each of the eight mirrors, $\alpha$ is an inclination, relative to the optical axis, of the chief ray from the first surface to the first mirror, and $RM_{1-8}$ is, in seven of the eight reflective mirrors, the absolute value of a center radius of curvature of the reflective surface of the respective mirror.

18. An exposure apparatus, comprising:
an illumination-optical system situated and configured to illuminate a mask situated on the first surface; and
a projection optical system as recited in claim 1, situated and configured to project, onto a photosensitive substrate situated at the second surface, an image of the pattern of the mask.

19. The exposure apparatus of claim 18, wherein:
the illumination-optical system comprises a light source configured to supply X-rays as exposure light; and
the mask and the photosensitive substrate are moved relative to the projection-optical system, to project the mask pattern onto and expose the photosensitive substrate.

20. A device-manufacturing method, comprising:
performing an exposure process, using the exposure apparatus as recited in claim 19, to expose the photosensitive substrate to the mask pattern; and
developing the photosensitive substrate after the exposure process.

21. A projection-optical system that forms, on a second surface, a reduced image of a first surface, the system comprising:
a first reflective image-forming optical system situated and configured to form an intermediate image of the first surface, based on light from the first surface;
a second reflective image-forming optical system situated and configured to form the reduced image on the second surface, based on light from the intermediate image;
the first reflective image-forming optical system comprising, in order of light incidence from the first surface, a first reflective mirror having a concave reflective surface, a second reflective mirror having a convex reflective surface, a third reflective mirror, and a fourth reflective mirror having a concave reflective surface;
the second reflective image-forming optical system comprising, in order of light incidence from the intermediate image, a fifth reflective mirror having a concave reflective surface, a sixth reflective mirror, a seventh reflective mirror having a convex reflective surface, and an eighth reflective mirror having a concave reflective surface; and
satisfying a condition $RM_{1-8}/H_0 \leq 12$, wherein $RM_{1-8}$ is the absolute value of a center radius of curvature of the reflective surface of the respective mirror, and $H_0$ is a maximum object height on the first surface.

22. The system of claim 21, further satisfying a condition $1 < RM_2/H_0 < 6$, wherein $RM_2$ is the absolute value of a center radius of curvature of the reflective surface of the second mirror.

23. The system of claim 21, further satisfying a condition $4 < RM_3/H_0 < 13$, wherein $RM_3$ is the absolute value of a center radius of curvature of the reflective surface of the third mirror.

24. The system of claim 21, further satisfying a condition $1 < RM_1/H_0 < 6$, wherein $RM_1$ is the absolute value of a center radius of curvature of the reflective surface of the first mirror.

25. The system of claim 21, further satisfying a condition $4 < RM_4/H_0 < 12$, wherein $RM_4$ is the absolute value of a center radius of curvature of the reflective surface of the fourth mirror.

26. The system of claim 21, further satisfying a condition $0.1 < RM_8/H_0 < 4$, wherein $RM_8$ is the absolute value of a center radius of curvature of the reflective surface of the eighth mirror.

27. The system of claim 21, wherein the third reflective mirror has a concave reflective surface.

28. The system of claim 21, further satisfying a condition $0.1 < RM_7/H_0 < 3$, wherein $RM_7$ is the absolute value of a center radius of curvature of the reflective surface of the seventh mirror.

29. The system of claim 21, further satisfying a condition $4 < TT/H_0 < 8$, wherein TT is an interval on the optical axis between the first surface and the second surface.

30. The system of claim 21, further comprising an aperture stop situated at, or in proximity to, the reflective surface of the second mirror.

31. The system of claim 21, having a numerical aperture, on the side of the second surface, that is larger than 0.45.

32. The system of claim 21, configured to form a reduced image in an arc-shaped effective image-formation region on the second surface, wherein the arc-shaped effective image-formation region has a width greater than 0.5 mm.

33. The system of claim 21, further satisfying a condition $\phi_M/H_0 \leq 5$, wherein $\phi_M$ is an effective radius of each of the eight mirrors.

34. The system of claim 21, further satisfying a condition $5° < |\alpha| < 10°$, wherein $\alpha$ is an inclination, relative to the optical axis, of the chief ray from the first surface to the first mirror.

35. An exposure apparatus, comprising:

an illumination-optical system situated and configured to illuminate a mask situated on the first surface; and a projection-optical system, as recited in claim 21, situated and configured to project, onto a photosensitive substrate situated at the second surface, an image of the pattern of the mask.

36. The exposure apparatus of claim 35, wherein:

the illumination-optical system comprises a light source configured to supply X-rays as exposure light; and the mask and the photosensitive substrate are moved relative to the projection-optical system, to project the mask pattern onto and expose the photosensitive substrate.

37. A device-manufacturing method, comprising:

performing an exposure process, using the exposure apparatus as recited in claim 35, to expose the photosensitive substrate to the mask pattern; and developing the photosensitive substrate after the exposure process.

* * * * *